United States Patent
Takeuchi

(10) Patent No.: US 8,149,049 B2
(45) Date of Patent: Apr. 3, 2012

(54) LOW NOISE RECEIVING APPARATUS

(75) Inventor: Tomohiko Takeuchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 377 days.

(21) Appl. No.: 12/434,153

(22) Filed: May 1, 2009

(65) Prior Publication Data

US 2009/0298455 A1   Dec. 3, 2009

(30) Foreign Application Priority Data

May 28, 2008   (JP) ................... 2008-139072

(51) Int. Cl.
*H03F 1/14* (2006.01)
*H03F 3/04* (2006.01)
(52) U.S. Cl. .......................... 330/51; 330/302
(58) Field of Classification Search .............. 330/51, 330/151, 285, 294, 302
See application file for complete search history.

(56) References Cited

U.S. PATENT DOCUMENTS

| 6,967,528 B2 * | 11/2005 | Takagi ............... 330/51 |
| 2004/0124917 A1 | 7/2004 | Takagi |

FOREIGN PATENT DOCUMENTS

| JP | 10-084300 A | 3/1998 |
| JP | 2002185270 A | 6/2002 |
| JP | 2002246858 A | 8/2002 |
| JP | 2004-194105 A | 7/2004 |
| JP | 2008-028908 A | 2/2008 |

OTHER PUBLICATIONS

Communication dated Jan. 24, 2012 from the Japanese Patent Office in counterpart Japanese application No. 2008-139072.

* cited by examiner

*Primary Examiner* — Robert Pascal
*Assistant Examiner* — Khiem Nguyen
(74) *Attorney, Agent, or Firm* — Sughrue Mion, PLLC

(57) ABSTRACT

A low noise receiving apparatus includes an amplifier which inputs an input signal, an output matching circuit which is connected between the amplifier and an output terminal which matches an impedance of an output side of the amplifier, a bypass circuit which bypasses the amplifier and is connected to an output side of the output matching circuit, and a switching circuit having one end connected between the amplifier and the output matching circuit and the other end connected to an alternating current ground which switches whether or not to connect an output of the amplifier to the alternating current ground. In a bypass mode, the switching circuit connects the output of the amplifier to the alternating current ground in order to have a lower impedance viewed from the output terminal of the output matching circuit than in an amplification mode.

7 Claims, 8 Drawing Sheets

LOW NOISE RECEIVING APPARATUS

BACKGROUND OF THE INVENTION

1. Field of the Invention

The present invention relates to a low noise receiving apparatus provided in a high-frequency front-end circuit, and particularly to a low noise receiving apparatus which switches an amplification operation and a bypass operation depending on an input RF (Radio Frequency) signal strength. The amplification operation is to amplify the input RF signal by an amplifier, and the bypass operation is to bypass the amplifier.

2. Description of Related Art

In recent years, mobile terminals such as Wireless-LAN (Local Area Network), D-TV (Digital Television), and GPS (Global Positioning System) are increasing rapidly. In a low noise receiving apparatus mounted to such mobile terminal, generally an amplifier to amplify an RF signal is provided in a front-end circuit in order to obtain a good receive sensitivity. The mobile terminals can be used at any place without limitation, and low noise receiving apparatuses need to receive radio signals of various radio field strength according to the operation environment, such as indoor or outdoor, and the distance from a base station. In a case of receiving a strong radio field strength, such as when a mobile terminal is used in the vicinity of a base station, a signal strength input to the amplifier of the low noise receiving apparatus becomes strong, thereby saturating an amplified signal and reducing the distortion characteristics.

There is a method suggested in order to improve the above-mentioned issue, which is to bypass the amplifier and transmit an input RF signal to a subsequent stage as-is when the intensity of a received RF signal is strong (Japanese Unexamined Patent Application Publication No. 10-84300 and Japanese Unexamined Patent Application Publication No. 2008-28908). A switching device for bypass must be provided in a low noise receiving apparatus having such function to bypass an amplifier. As the miniaturization of mobile terminals advances, the low noise receiving apparatuses are required to be further miniaturized and simplified.

FIG. 7 is a block diagram illustrating an apparatus disclosed in Japanese Unexamined Patent Application Publication No. 10-84300. In FIG. 7, 61 is an LNA (Low Noise Amplifier), 62 and 63 are attenuators, 66 is an input matching circuit, 64 and 67 are output matching circuits, 68 is an RF (Radio Frequency) input terminal, 69 is an RF output terminal, and 65 is a 1 input 1 output switching circuit. The input matching circuit 66 matches an impedance of the input side of the LNA 61. The output matching circuit 67 matches an impedance of the output side of the LNA 61. If the radio field strength received from the RF input terminal 68 is smaller enough than input saturation power of the LNA 61, an RF signal is passed to an amplification path. At this time, the input/output terminals of the switch 65 are opened and the attenuator 62 is configured to be the minimum attenuation. As described above, if the radio field strength is small, a received RF signal passes through the input matching circuit 66 and the attenuator 62, amplified by the LNA 61, and output from the output terminal 69 via the output matching circuit 67.

If the power of the RF signal becomes large enough so that output power exceeds a predetermined threshold value Pmax even after setting the attenuator 62 to the maximum attenuation, the received RF signal is passed to the bypass path. That is, the attenuator 62 is set to the maximum attenuation to short-circuit between the input and the output terminals of the switch 65. The attenuation of the attenuator 63 is adjusted so that a mixer in the subsequent stage is not saturated. As described above, if the signal strength of an RF signal is large, the received RF signal is output from the output terminal 69 via the attenuator 63, the output matching circuits 64 and 67. Even when the radio field strength of the received RF signal is large, a bypass path can keep an RF output within a specified range and prevent from saturating non-linear devices such as an amplifier and a mixer.

FIG. 8 is a block diagram illustrating the apparatus disclosed in Japanese Unexamined Patent Application Publication No. 2008-28908. In this apparatus, as with Japanese Unexamined Patent Application Publication No. 10-84300, an RF signal input from the input terminal 81 via the input matching circuit 82 is output to the output matching circuit 87 via either the bypass circuit 83 or the amplifier circuit 84 depending on the amplitude. The transistors 85 and 86 included in the amplifier 84 compose an amplifier. A first control circuit 90 supplies a gate voltage of the transistors 88 and 89, which function as switches of the bypass circuit 83 and the amplifier circuit 84. The first control circuit 90 controls the received RF signal to be input to either the bypass circuit 83 or the amplifier circuit 84 by controlling the gate voltage of the transistors 88 and 89 according to the signal strength of the received RF signal. An output of the bypass circuit 83 or the amplifier circuit 84 is input to the common output matching circuit 87.

The apparatus disclosed in Japanese Unexamined Patent Application Publication No. 2008-28908 enables to reduce the number of the output matching circuits by sharing the output matching circuit 87 between the bypass circuit 83 and the amplifier circuit 84, as compared to the circuit configuration disclosed in Japanese Unexamined Patent Application Publication No. 10-84300, which is illustrated in FIG. 8.

However, two output matching circuits (64 and 67) are provided as matching circuits of output side in the apparatus disclosed in Japanese Unexamined Patent Application Publication No. 10-84300 in order to match the impedance of the bypass path and the amplifier path. Generally a capacitor or an inductor device is used as the matching circuit. Therefore, the apparatus disclosed in Japanese Unexamined Patent Application Publication No. 10-84300 requires more devices and generates problems such as increasing the circuit size and cost. Further, the capacitor or the inductor used for the matching circuit generally has large circuit size. This generates problems of increasing the chip area and also the chip cost.

Moreover, in the apparatus disclosed in Japanese Unexamined Patent Application Publication No. 2008-28908, an input of the output matching circuit is common to the bypass path and the amplifier path. The impedance of the output matching circuit 87 is specified to have good characteristics of the path which passes through the amplifier circuit 84. Therefore, the inventor has found a problem that when passing through the bypass circuit 83, an inconsistency is generated in the impedance of the output matching circuit 87, and the loss of the bypass signal becomes larger.

SUMMARY

An exemplary aspect of an embodiment of the present invention is a low noise receiving apparatus having an amplifier which amplifies a received input signal, an output matching circuit connected between the amplifier and an output terminal which matches an impedance of an output side of the amplifier, a bypass circuit which bypasses the amplifier and has an output connected to an output side of the output matching circuit, and a switching circuit which switches whether or not to connect an output of the amplifier to an alternating current ground, where the switching circuit having one end connected between the amplifier and the output matching circuit and another end connected to the alternating current ground. The low noise receiving apparatus has an amplification mode in which the input signal is output to the output terminal via the amplifier and a bypass mode in which the amplifier is bypassed to output the input signal to the output terminal via the bypass circuit. In the amplification mode, the switch circuit separates the output of the amplifier from the alternating current ground so that an impedance of the output side of the amplifier is matched by the output matching circuit. In the bypass mode, the switching circuit connects the output of the amplifier to the alternating current ground so that an impedance of the output matching circuit viewed from the output terminal side becomes lower than in the amplification mode.

In an exemplary aspect of an embodiment of the present invention, an output of the bypass circuit is connected to the output side of the output matching circuit, and the switching circuit selectively connects the output of the amplifier to an alternating current ground. This enables to switch an impedance viewed from the output terminal of the output matching circuit between the amplification mode and the bypass mode. This enables to reduce the number of output matching circuits and also reduce the loss of the bypass signal in the bypass mode.

The low noise receiving apparatus according to an exemplary embodiment of the present invention enables to reduce the number of the output matching circuit and also reduces the loss of the bypass signal in the bypass mode.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereafter, an embodiment of the invention is described with reference to the drawings.

Figure 1:
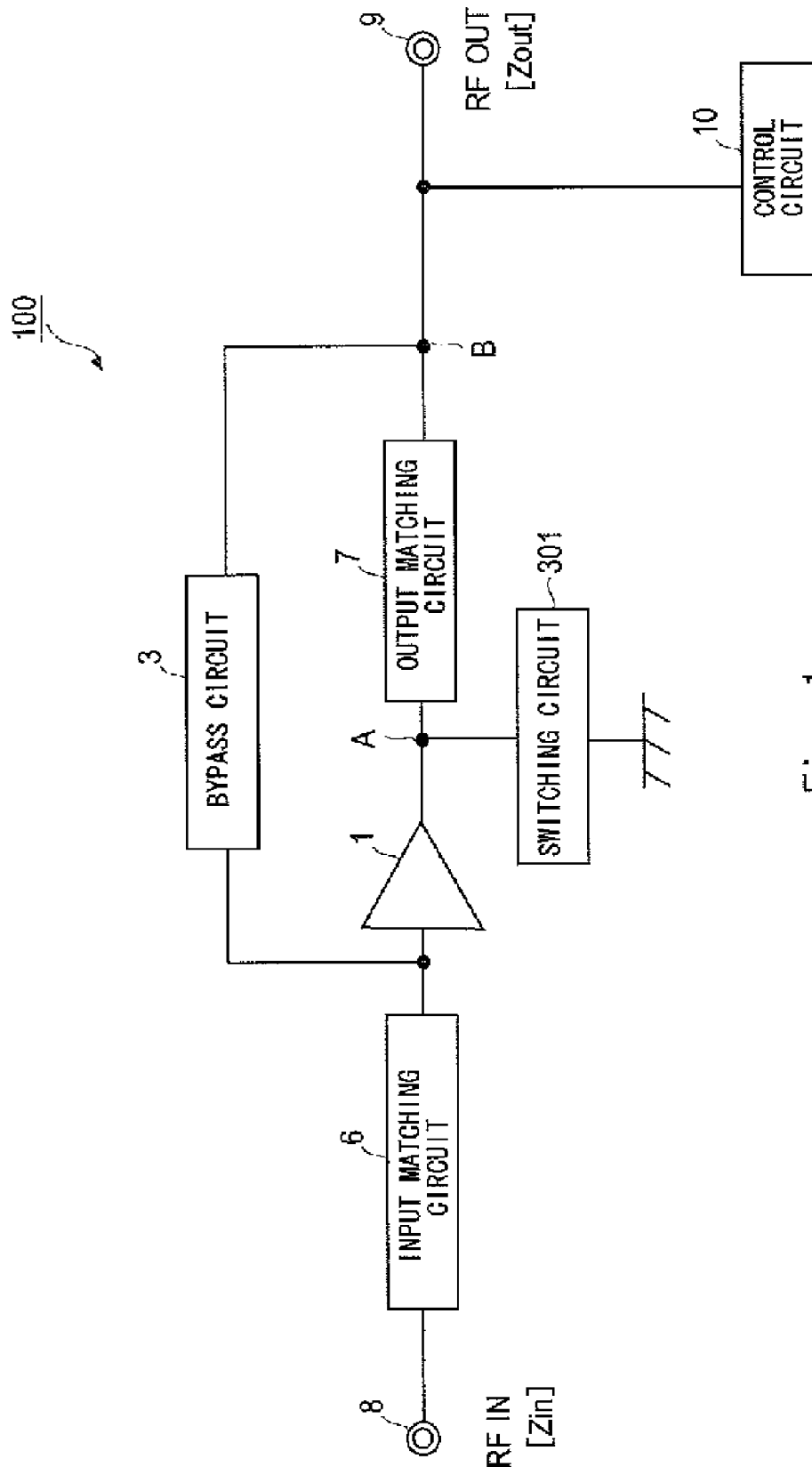
FIG. 1 a block diagram showing a configuration example of a low noise receiving apparatus according to an exemplary embodiment of the present invention.

FIG. 1 is a block diagram illustrating a configuration example of a low noise receiving apparatus according to the exemplary embodiment of the present invention. A low noise receiving apparatus 100 includes an amplifier 1 for amplifying an input signal RF_IN, an output matching circuit 7 connected between the amplifier 1 and an output terminal 9 for matching an impedance of the output side of the amplifier 1, a bypass circuit 3 having its output connected to the output side of the output matching circuit 7 for bypassing the amplifier 1, and a switching circuit 301 having one end connected between the amplifier 1 and the output matching circuit 7, and the other end connected to an alternating current ground for switching the output of the amplifier 1 to connect to the alternating current ground or not.

There are two modes for the low noise receiving apparatus 100 depending on the amplitude of the input signal RF_IN; an amplification mode in which the input signal RF_IN is output to the output terminal 9 via the amplifier 1, and a bypass mode in which the input signal RF_IN is bypassed to the amplifier 1 to output the input signal RF_IN to the output terminal 9 via the bypass circuit 3. If the amplitude of the input signal RF_IN is small, the low noise receiving apparatus 100 is set to be the amplification mode in which the input signal RF_IN is output to the output terminal 9 via the amplifier 1. In the amplification mode, the output matching circuit 7 matches the impedance of the output side of the amplifier 1 by separating the output of the amplifier 1 from the alternating current ground by the switching circuit 301.

If the amplitude of the input signal RF_IN is large, the low noise receiving apparatus 100 is set to the bypass mode in which the input signal is output to the output terminal 9 via the bypass circuit 3. In the bypass mode, the switching circuit 301 connects the output of the amplifier 1 to the alternating current ground in order to have an impedance viewed from the output terminal 9 of the output matching circuit 7 lower than in the amplification mode.

A control circuit 10 is provided in the low noise receiving apparatus 100. The control circuit 10 compares the amplitude of the output signal of the output terminal 9 with a predetermined threshold to evaluate if the amplitude of the input signal RF_IN is large enough so that it is not necessary to pass through the amplifier 1. If the output of the output terminal 9 is smaller than the predetermined threshold, the control circuit 10 determines that the amplitude of the input signal RF_IN is small and sets the low noise receiving apparatus 100 to the amplification mode. If the output of the output terminal 9 exceeds the predetermined threshold, the control circuit 10 determines that the amplitude of the input signal RF_IN is large and sets the low noise receiving apparatus 100 to the bypass mode.

The configuration of the low noise receiving apparatus 100 is explained with reference to FIG. 1. An input matching circuit 6 is provided in the low noise receiving apparatus 100 for matching an impedance of the input side of the amplifier 1. One end of the input matching circuit 6 is connected to the input terminal 8, and the output of the input matching circuit 6 is connected to the input of the amplifier 1.

The input of the amplifier 1 is connected to the input matching circuit 6. The output of the amplifier 1 is connected to the alternating current ground via the switching circuit 301 and also to the output matching circuit 7. An output node of the amplifier 1 is hereinafter referred to as a node A. The impedance of the input side of the amplifier 1 is matched by the input matching circuit 6. The impedance of the output side is matched by the output matching circuit 7.

The switching circuit 301 is connected between the node A and the alternating current ground. The switching circuit 301 switches the impedance viewed from the output terminal 9 of the output matching circuit 7 according to whether or not to connect the node A to the alternating current ground. The above-mentioned control circuit controls ON/OFF of the switching circuit 301.

The output matching circuit 7 is set to the value for matching the impedance of the output side of the amplifier 1. The output matching circuit 7 is connected to the output side of the amplifier 1. The output matching circuit 7 switches the impedance viewed from the output terminal 9 whether or not the switch circuit 301 connects the output of the amplifier 1 to the alternating current ground or not. An output node of the output matching circuit 7 is hereinafter referred to as a node B.

The output matching circuit 7 matches the impedance of the output side of the amplifier 1 by separating the output side of the amplifier 1 from the alternating current ground in the amplification mode. On the other hand, in the bypass mode, the output of the amplifier 1 is connected to the alternating current ground by the switching circuit 301. That is, the terminal connected between the amplifier 1 and the output matching circuit 7 is connected to the alternating current ground. Then, in the bypass mode, the output matching circuit 7 sets the impedance viewed from the output terminal 9 to be lower than in the amplification mode.

The bypass circuit 3 is connected between the output of the input matching circuit 6 and the input of the amplifier 1, and to the node B. The bypass circuit 3 is configured to be a bypass path for bypassing the amplifier 1 and the output matching circuit 7 in the bypass mode. The bypass circuit 3 is composed of a switch, as described later, and ON/OFF is controlled by the abovementioned control circuit.

Figure 2:
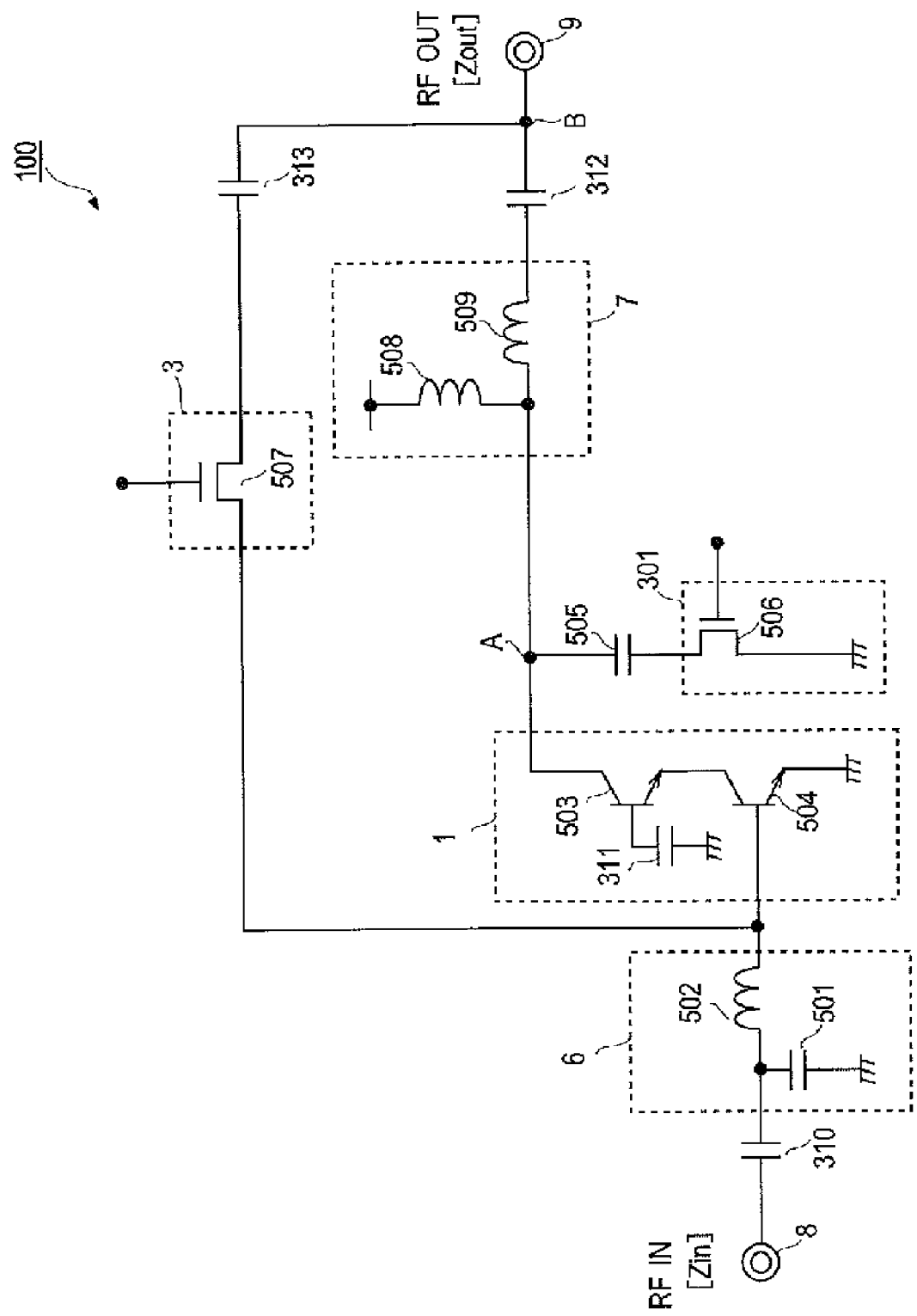
FIG. 2 is a circuit diagram showing a configuration example of the low noise receiving apparatus according to the exemplary embodiment of the present invention.

FIG. 2 is a circuit diagram illustrating the more detailed configuration example of the low noise receiving apparatus according to the exemplary embodiment of the present invention. The input matching circuit 6 includes a capacitor 501 and a coil 502. One end of the coil 502 is connected to the input terminal 8 via a DC blocking capacitor 310 and also connected to the ground via the capacitor 501. The other end of the coil 502 is connected to the bypass circuit 3 and also to the amplifier 1. It is noted that the configuration of the input matching circuit 6 is not limited to this but a resistor or the like may be used according to the configuration of the amplifier 1.

The amplifier 1 is composed of a transistor which is cascode connected. The amplifier 1 is composed by connecting two stages of bipolar transistors, for example. The amplifier 1 includes NPN transistors 503 and 504 and a capacitor 311. As for the NPN transistor 503, a collector is connected to the node A, a base is connected to the ground via the capacitor 311, and an emitter is connected to the collector of the NPN transistor 504. As for the NPN transistor 504, a collector is connected to the emitter of the NPN transistor 503, a base is connected to the coil 502 of the input matching circuit 6, and an emitter is connected to the ground.

The output of the amplifier 1 (node A) is connected to the switching circuit 301 via the capacitor 505 and also to the output matching circuit 7. The switching circuit 301 includes a MOS transistor 506. One end of the MOS transistor 506 is connected to the node A via the capacitor 505 and the other end is connected to the alternating current ground. Turning on and off the MOS transistor 506 enables to switch the node A to be connected to the alternating current ground or not. The MOS transistor 506 is turned on in the bypass mode and by connecting the node A to the alternating current ground, the output matching circuit 7 is set to low impedance. The switching circuit 301 is turned off in the amplification mode and separates the node A from the alternating current ground.

The bypass circuit 3 includes a MOS transistor 507. One end of the MOS transistor 507 is connected to the output side of the input matching circuit 6, and the other end is connected to the node B via the DC blocking capacitor 313. In the amplification mode, the MOS transistor 507 is turned off and the received input signal RF_IN is output to the node B via the amplifier 1 and the output matching circuit 7. In the bypass mode, the MOS transistor 507 is turned on and the received input signal RF_IN is output to the output terminal 9 via the bypass circuit 3.

One end of the switching circuit 301 is connected between the nodes A and B, and the other end is connected to the alternating current ground. Capacitors 310, 311, 312, and 313 are DC blocking capacitors.

The output matching circuit 7 includes coils 508 and 509. One end of the coil 508 is connected to a power supply, and the other end is connected to the node A. One end of the coil 509 is connected to the power supply via the coil 508, and the other end is connected to the node B via the capacitor 312. It is noted that the configuration of the output matching circuit 7 is not limited to this, and a capacitor or a resistor may be used instead of the coil 509 according to the configuration of the amplifier 1.

Figure 3:
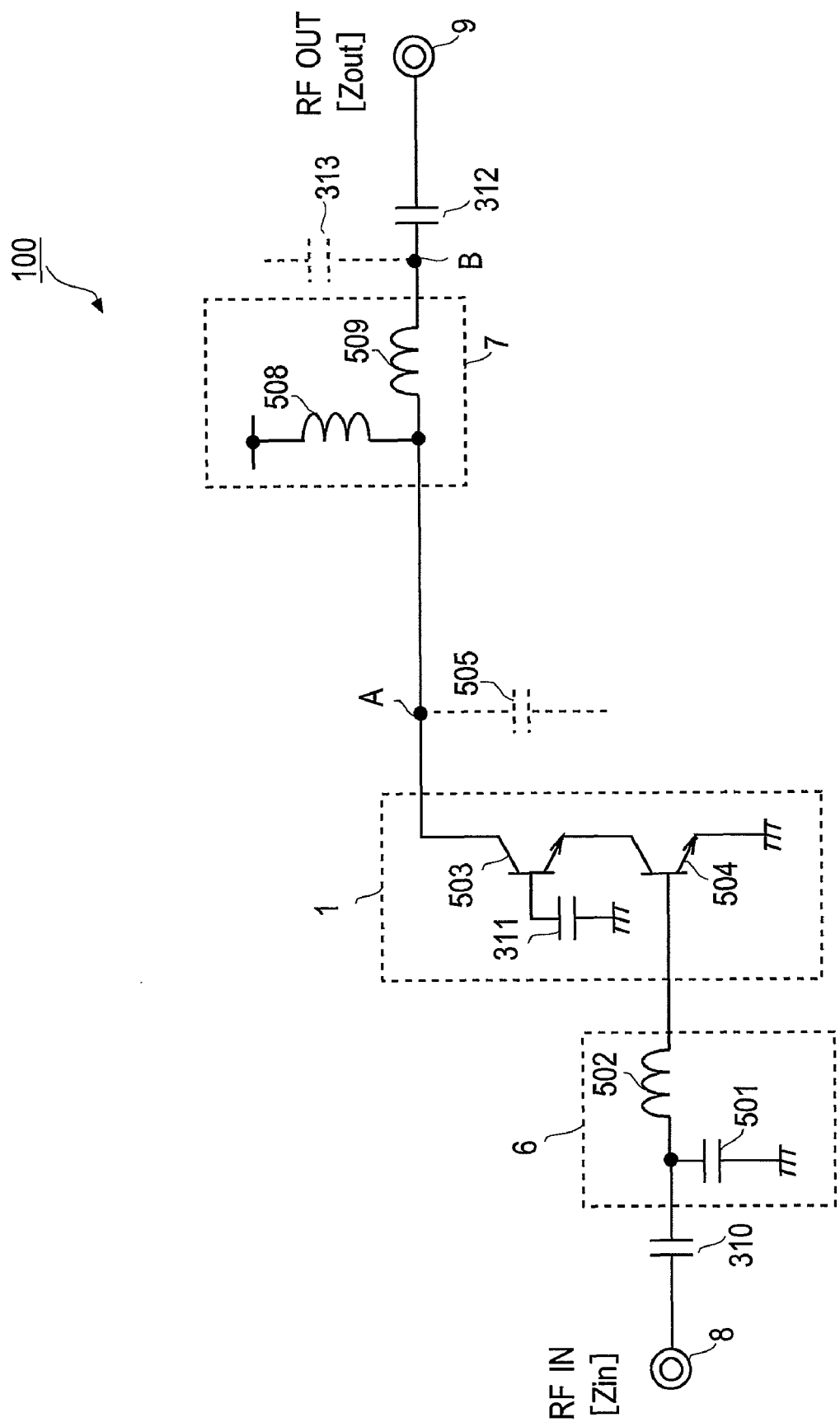
FIG. 3 illustrates the low noise receiving apparatus in a normal operation according to the exemplary embodiment of the present invention.
Figure 4:
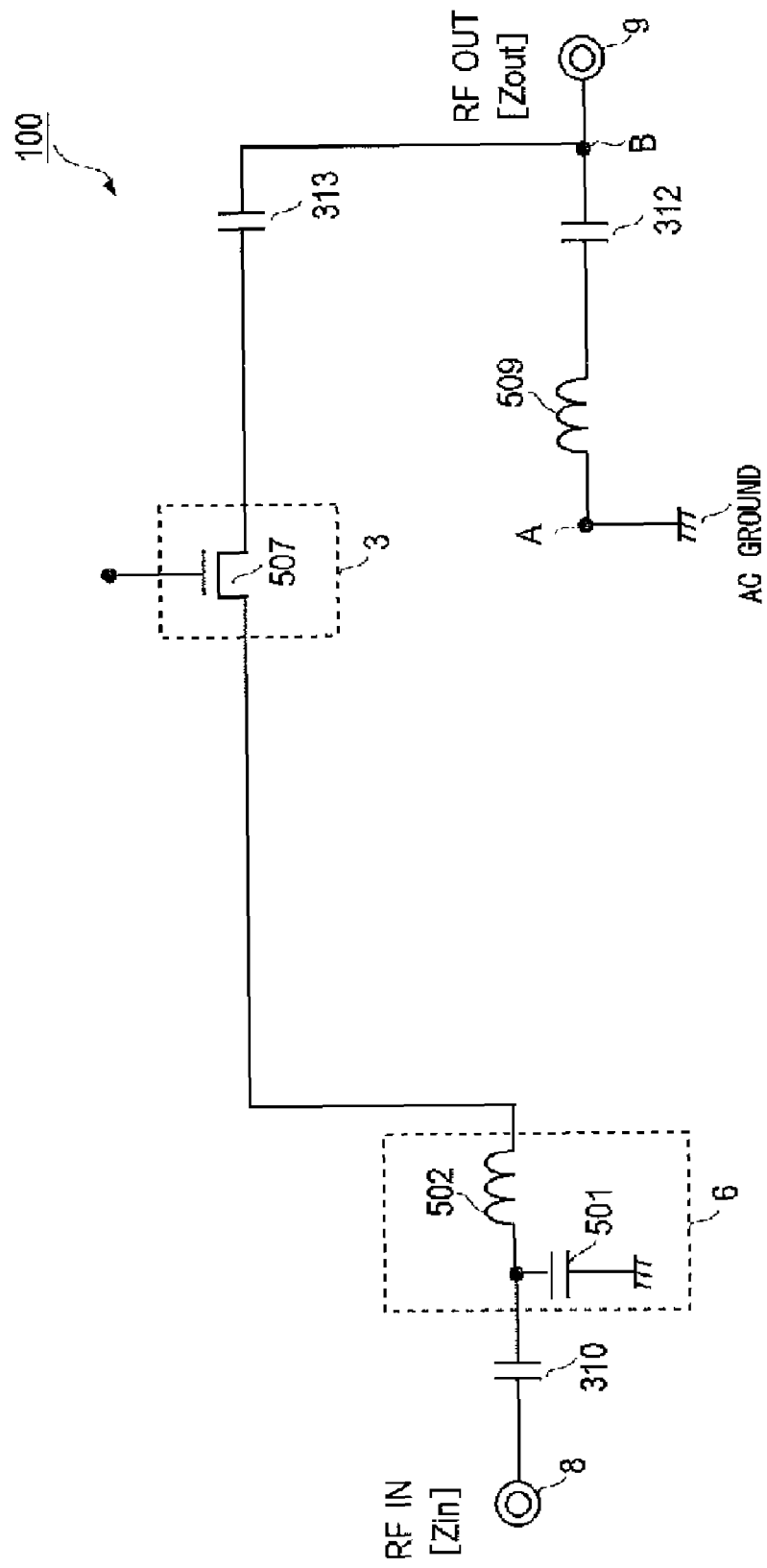
FIG. 4 illustrates the low noise receiving apparatus in a bypass operation according to the exemplary embodiment of the present invention.

Next, an operation of the low noise receiving apparatus 100 according to an exemplary embodiment of the present invention is described with reference to FIGS. 3 and 4. FIG. 3 illustrates the operation of the low noise receiving apparatus 100 in the amplification mode. FIG. 4 illustrates the operation of the low noise receiving apparatus 100 in the bypass mode.

In the amplification mode illustrated in FIG. 3, the amplifier 1 is in the operating state. The MOS transistor 507 in the bypass circuit 3 shown in FIG. 2 is turned off. Further, the MOS transistor 506 of the switching circuit 301 illustrated in FIG. 2 is turned off. The RF signal input from the input terminal 8 is input to the amplifier 1 via the input matching circuit 6, amplified by the amplifier 1, and output from the output terminal 9 via the output matching circuit 7. In the amplification mode, the output matching circuit 7 operates so that the impedance of the output side of the amplifier 1 is matched.

At this time, there is no characteristic degradation (NF or loss) caused by an impedance mismatch in the input signal of the amplifier 1. The input signal is amplified by the amplifier 1. The output matching circuit 7 matches the impedance of the output of the amplifier 1 and an impedance Zout, which is a subsequent stage of the output terminal. The amplified signal is output from the output terminal 9. At this time, an isolation between input and output of the bypass circuit 3 and the switching circuit 301 is high enough to ignore a signal loss caused by a low noise amplification operation by the switch.

In the bypass mode illustrated in FIG. 4, the amplifier 1 is in a non-operating state. The MOS transistor 507 of the bypass circuit 3 is turned on and the bypass circuit 3 is to be a signal path. Further, in the bypass mode, the MOS transistor 506 of the switch circuit 301 is turned on. The node A is connected to the alternating current ground. The signal amplified by the amplifier 1 is output from the node A in the amplification mode. As a result, the impedance viewed from the output terminal 9 of the output matching circuit 7 is set to be lower impedance than the impedance in the amplification mode. At this time, only the unmatched part of the impedance by the input matching circuit 6 is output from the output terminal 9.

Figure 5:
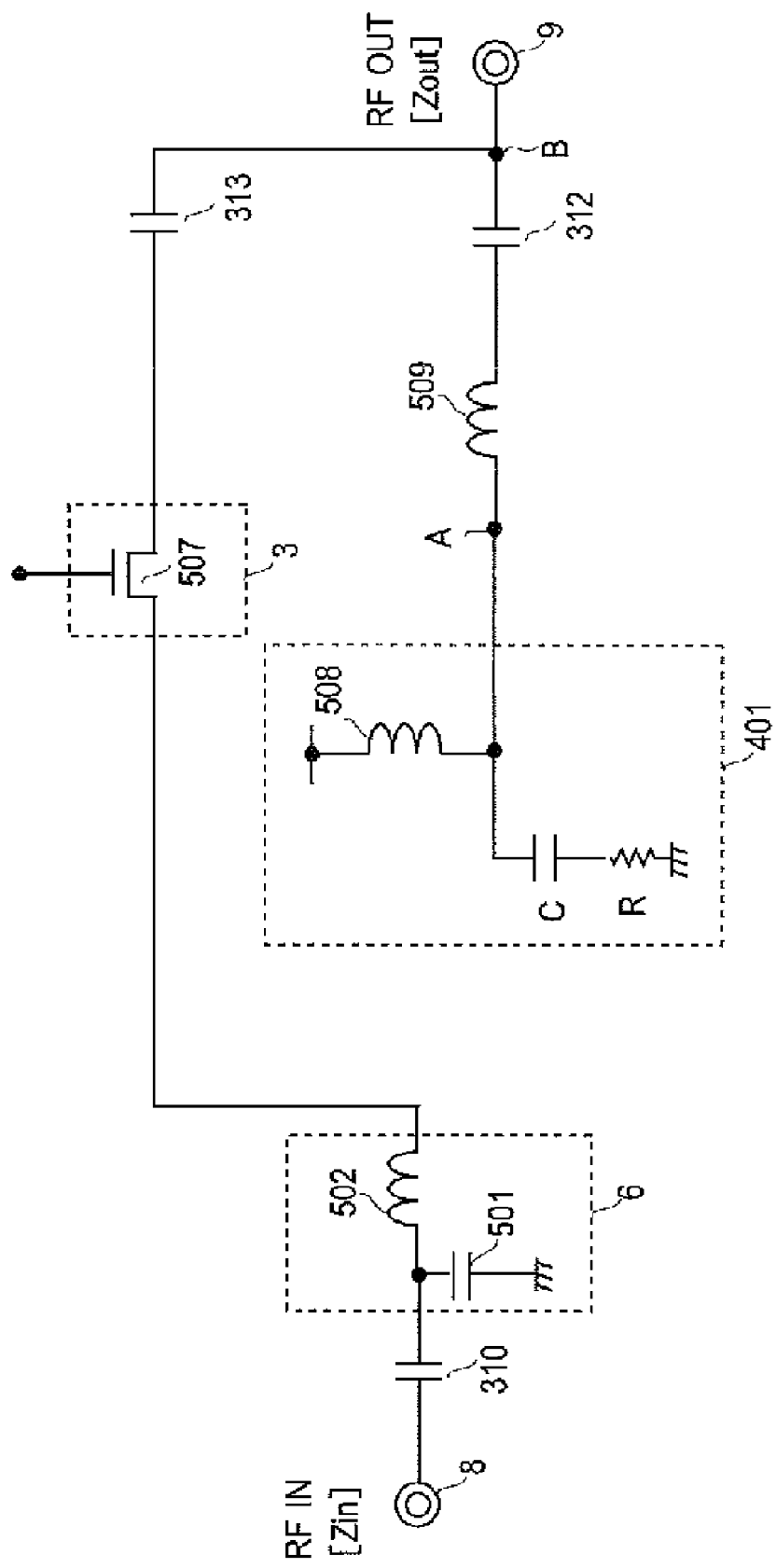
FIG. 5 illustrates a circuit configuration without a switching circuit.

Next, the role of the switching circuit 301 is explained. FIG. 5 illustrates a circuit configuration of the low noise receiving apparatus 100 without the switching circuit 301 according to the exemplary embodiment of the present invention. In FIG. 5, a parasitic capacitance of the amplifier 1 is represented as C, and a parasitic resistance is represented as R. As illustrated in FIG. 5, the parasitic capacitance C of the amplifier 1 and the coil 508 of the output matching circuit 7 compose a resonator 401. The output matching circuit 7 sets the impedance of the output side of the amplifier 1. A resonance frequency of the resonator 401 is almost equivalent to a predetermined frequency, which is matched by the output matching circuit 7. In other words, the condition to match the impedance of the output side of the amplifier 1 is same as the condition in which a resonance phenomenon of an LC circuit is generated.

Therefore, as for the signal bypassed the amplifier 1, a desired frequency will not be output from the output terminal 9 by a resonance of the resonator 401. On the other hand, in this embodiment, the switching circuit 301 eliminates the resonator 401, which is composed of the parasitic capacitance C of the amplifier 1 and the coil 508 of the output matching circuit 7. This enables to prevent a signal loss caused by a resonance phenomenon.

Figure 6:
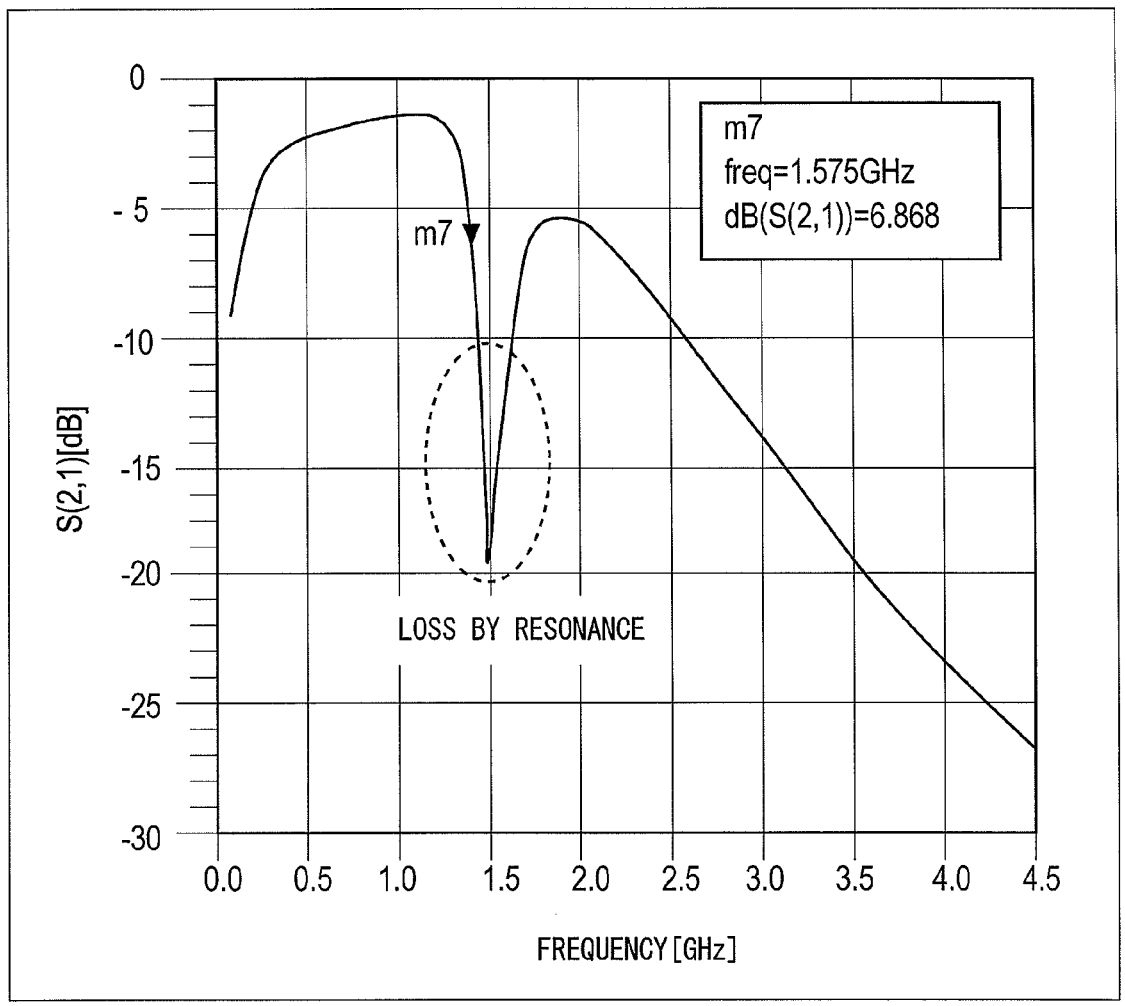
FIG. 6 is a graph showing a simulation result of a resonance phenomenon.
Figure 7:
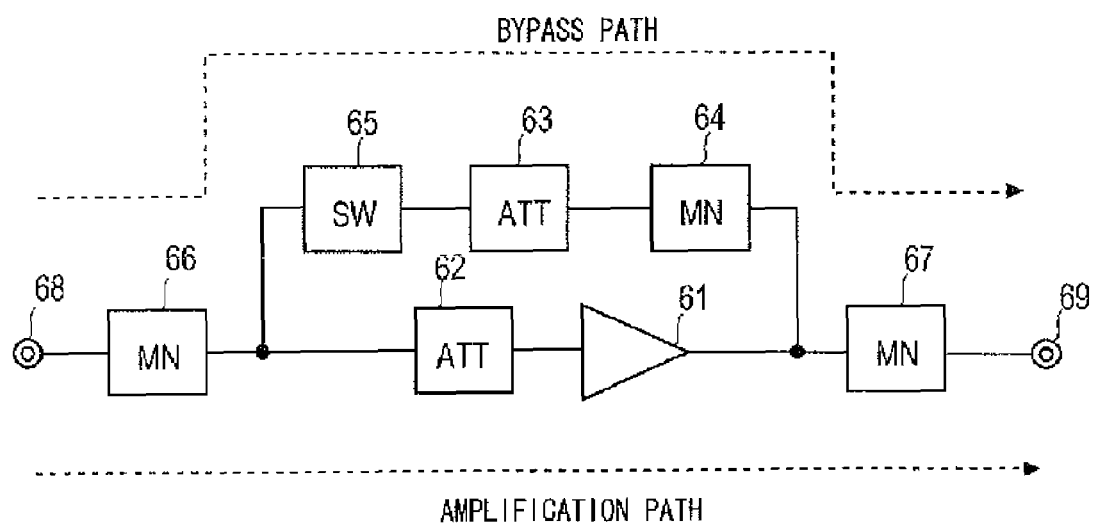
FIG. 7 illustrates a configuration example of a wireless low noise receiving apparatus disclosed in Japanese Unexamined Patent Application Publication No. 10-84300.
Figure 8:
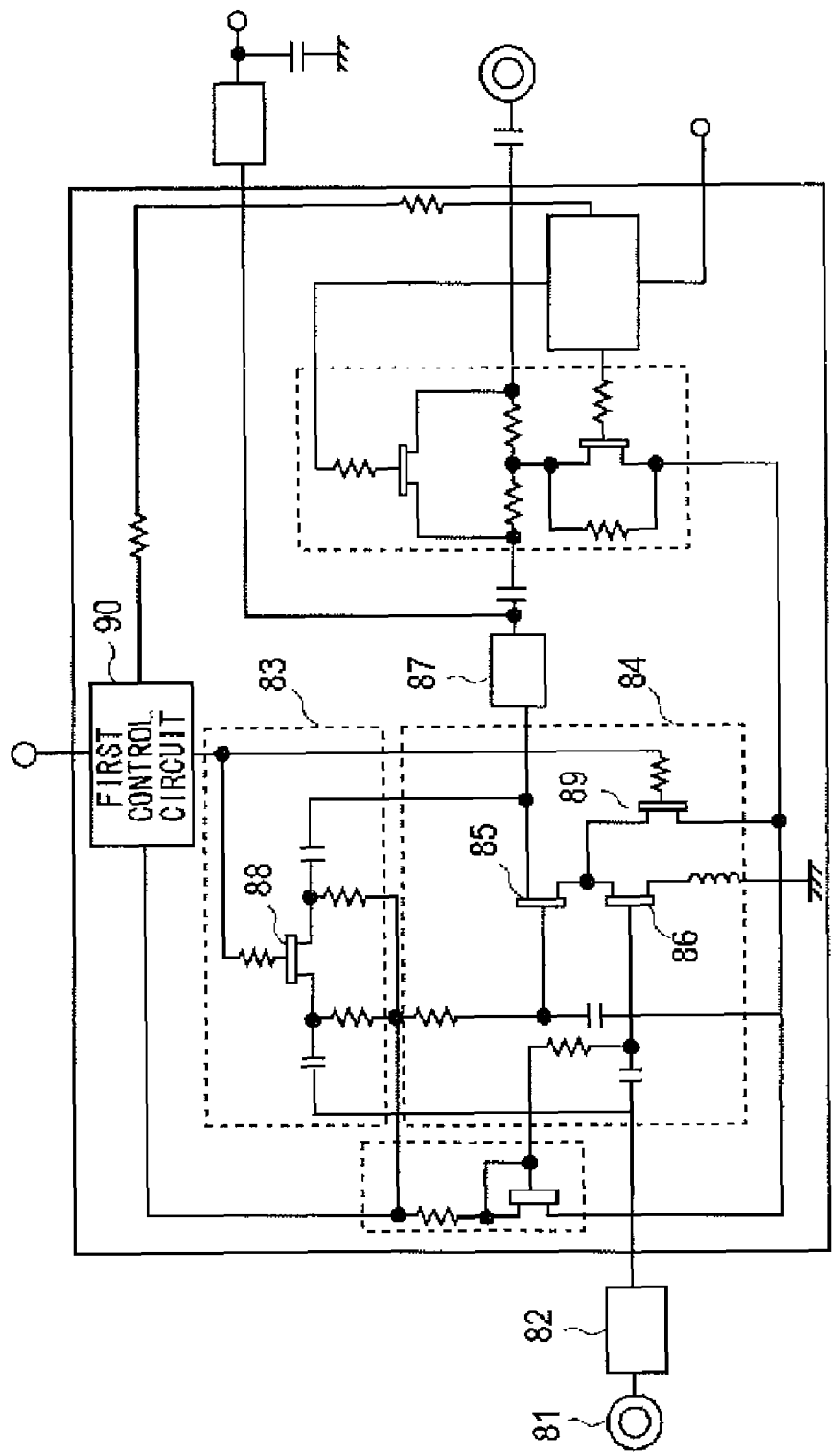
FIG. 8 illustrates a configuration example of a radio low noise receiving apparatus disclosed in Japanese Unexamined Patent Application Publication No. 2008-28908.

FIG. 6 illustrates the simulation result of the resonance phenomenon. FIG. 6 illustrates an insertion loss characteristic by a S parameter in the bypass mode for the circuit of FIG. 5, when matching the impedance when entering the amplification mode in a narrowband of 1.575 GHz. As shown in FIG. 6, in the bypass mode, a resonance phenomenon and a large signal loss are generated near 1.575 GHz, where the impedance is matched.

On the other hand, the exemplary embodiment of the present invention provides the switching circuit 301 between the amplifier 1 and the input of the output matching circuit 7 to cause the switching circuit 301 to be conductive at the time of bypass. This enables to set the node B to have almost the same impedance as the alternating current ground. Therefore, it is possible to prevent from generating the resonator 401, which is composed of the parasitic capacitance of the amplifier 1 and the output matching circuit 7, and also to reduce the signal loss caused by the resonance.

As described above, in the present invention, the output of the bypass circuit 3 is connected to the output side of the output matching circuit 7 and the switching circuit 301 is provided for switching whether or not to connect the output of the amplifier 1 to the alternating current ground. This makes it possible to switch the impedance viewed from the output side of the output matching circuit 7 in the bypass mode and the amplification mode. Furthermore, this enables to prevent from generating an LC resonator, which is composed of the parasitic capacitance C of the amplifier 1 and the output matching circuit 7. Therefore, it is possible to prevent from a signal loss caused by an LC resonance phenomenon in the bypass mode.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A low noise receiving apparatus comprising:
   an amplifier which amplifies a received input signal;
   an output matching circuit connected between the amplifier and an output terminal which matches an impedance of an output side of the amplifier;
   a bypass circuit which bypasses the amplifier and has an output connected to an output side of the output matching circuit; and
   a switching circuit which switches whether or not to connect an output of the amplifier to an alternating current ground, the switching circuit having one end connected between the amplifier and the output matching circuit and another end connected to the alternating current ground;
   wherein the low noise receiving apparatus has an amplification mode in which the input signal is output to the output terminal via the amplifier and a bypass mode in which the amplifier is bypassed to output the input signal to the output terminal via the bypass circuit,
   in the amplification mode, the switch circuit separates the output of the amplifier from the alternating current ground so that an impedance of the output side of the amplifier is matched by the output matching circuit, and
   in the bypass mode, the switching circuit connects the output of the amplifier to the alternating current ground so that an impedance of the output matching circuit viewed from the output terminal side becomes lower than in the amplification mode.

2. The low noise receiving apparatus according to claim 1, wherein the output matching circuit is connected between a power supply and the amplifier, and comprises a coil which supplies a bias voltage to the amplifier.

3. The low noise receiving apparatus according to claim 1, further comprising a control circuit which monitors an output of the output terminal,
   wherein the control circuit sets the low noise receiving apparatus to the amplification mode if the output of the output terminal is less than a predetermined value and sets the low noise receiving apparatus to the bypass mode if the output of the output terminal is more than or equal to the predetermined value.

4. The low noise receiving apparatus according to claim 1, further comprising an input matching circuit which is connected to an input side of the amplifier and matches an impedance of the input side of the amplifier.

5. The low noise receiving apparatus according to claim 1, wherein the amplifier is composed by a bipolar transistor connected in cascode.

6. The low noise receiving apparatus according to claim 1, wherein the bypass circuit is a switch.

7. The low noise receiving apparatus according to claim 6, wherein the switch is a field effect transistor.

* * * * *